United States Patent
Huang et al.

(10) Patent No.: US 11,789,090 B2
(45) Date of Patent: Oct. 17, 2023

(54) POWER DETECTION CIRCUIT AND CONTROL CIRCUIT

(71) Applicant: Delta Electronics, Inc., Taoyuan (TW)

(72) Inventors: Ming-Shi Huang, Taoyuan (TW); Zheng-Feng Li, Taoyuan (TW); Jhih-Cheng Hu, Taoyuan (TW); Yi-Liang Lin, Taoyuan (TW); Yu-Min Meng, Taoyuan (TW); Chun-Wei Lin, Taoyuan (TW); Chun Chang, Taoyuan (TW); Thiam-Wee Tan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/728,551

(22) Filed: Apr. 25, 2022

(65) Prior Publication Data
US 2023/0213591 A1    Jul. 6, 2023

(30) Foreign Application Priority Data

Dec. 30, 2021 (CN) .......................... 202111652210.5

(51) Int. Cl.
*G01R 31/40* (2020.01)
*H02M 1/12* (2006.01)
*H02M 1/00* (2006.01)
*G05F 1/10* (2006.01)

(52) U.S. Cl.
CPC ............... *G01R 31/40* (2013.01); *G05F 1/10* (2013.01); *H02M 1/0009* (2021.05); *H02M 1/12* (2013.01)

(58) Field of Classification Search
CPC ........ G01R 31/40; G05F 1/10; H02M 1/0009; H02M 1/12

USPC .................................... 324/764.01, 537, 500
See application file for complete search history.

(56) References Cited

U.S. PATENT DOCUMENTS

| | | | |
|---|---|---|---|
| 5,334,941 A | 8/1994 | King | |
| 9,143,097 B2 | 9/2015 | Hase | |
| 10,090,884 B2 | 10/2018 | Ettes et al. | |
| 10,715,047 B1 * | 7/2020 | Chiu | ............... H02M 3/33571 |
| 2017/0315037 A9 | 11/2017 | Huang et al. | |

(Continued)

FOREIGN PATENT DOCUMENTS

CN       204068705 (U)         12/2014

OTHER PUBLICATIONS

Office Action dated Aug. 2, 2022 in TW Application No. 110149703, 5 pages.

(Continued)

*Primary Examiner* — Giovanni Astacio-Oquendo
(74) *Attorney, Agent, or Firm* — Muncy, Geissler, Olds & Lowe, P.C.

(57) ABSTRACT

A power detection circuit is provided for detecting current total input power of a resonant circuit. The power detection circuit includes a detection circuit and an estimation circuit. The detection circuit receives a current signal and obtains resonant-slot baseband power according to the current signal to generate the baseband power value. The current signal represents a resonant-slot current generated by the resonant circuit. The estimation circuit receives the baseband power value and estimates the current total input power according to the baseband power value to generate an estimated power value.

17 Claims, 5 Drawing Sheets

(56) References Cited

U.S. PATENT DOCUMENTS

2018/0191252 A1* 7/2018 Bianco .................... H02M 1/08
2022/0170997 A1* 6/2022 Kundu ................... G01R 31/40

OTHER PUBLICATIONS

Helen N Schwerdt et al: "A Fully Passive Wireless Microsystem for Recording of Neuropotentials Using RF Backscattering Methods"; Journal of Microelectromechanical Systems. Vol 20. No. 5.; Oct. 1, 2011; pp. 1-12.
European Search Report corresponding to application No. 22194946.4 dated Jun. 6, 2023.

* cited by examiner

POWER DETECTION CIRCUIT AND CONTROL CIRCUIT

CROSS REFERENCE TO RELATED APPLICATIONS

This application claims priority of China Patent Application No. 202111652210.5, filed on Dec. 30, 2021, the entirety of which is incorporated by reference herein.

BACKGROUND OF THE INVENTION

Field of the Invention

The present invention relates to a power detection circuit, and more particularly to a control circuit for controlling a resonant circuit in response to detection of a resonant-slot baseband power.

Description of the Related Art

Resonant circuits are circuits used in electronic systems to convert energy. For example, resonant circuits are often used in transmission and reception devices for wireless signals, power converters, and the like. When a device uses a resonant circuit, the input power of the resonant slot in the resonant circuit determines the performance of the device. Therefore, it is necessary to detect the input power of the resonant slot, and control or adjust the subsequent circuits or devices of the device according to the detection result. However, in existing methods of detecting the input power of a resonant slot, the current and voltage of the resonant slot are usually obtained using high-speed sampling, multiplication, integration, and averaging, which increases the complexity of the operation and requires a high-level operation processor.

BRIEF SUMMARY OF THE INVENTION

Thus, the present invention provides a power detection circuit and a control circuit, which estimate input power of a resonant slot of a resonant circuit using resonant-slot baseband power and control the resonant circuit accordingly.

An exemplary embodiment of the present invention provides a power detection circuit for detecting current total input power of a resonant circuit. The power detection circuit comprises a detection circuit and an estimation circuit. The detection circuit receives a current signal and obtains resonant-slot baseband power according to the current signal to generate the baseband power value. The current signal represents a resonant-slot current generated by the resonant circuit. The estimation circuit receives the baseband power value and estimates the current total input power according to the baseband power value to generate an estimated power value.

Another exemplary embodiment of the present invention provides a control circuit for generating a first control signal to control a resonant circuit. The control circuit comprises a detection circuit, an estimation circuit, and an adjustment circuit. The detection circuit receives the current signal and obtains resonant-slot baseband power according to the current signal to generate a baseband power value. The current signal represents a resonant-slot current generated by the resonant circuit. The estimation circuit receives the baseband power value and estimates a current total input power of the resonant circuit according to the baseband power value to generate an estimated power value. The adjustment circuit receives the estimated power value and generates the first control signal. The adjustment circuit calculates a power difference between the estimated power value and a preset power value and adjusts a duty cycle of the first control signal according to the power difference.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
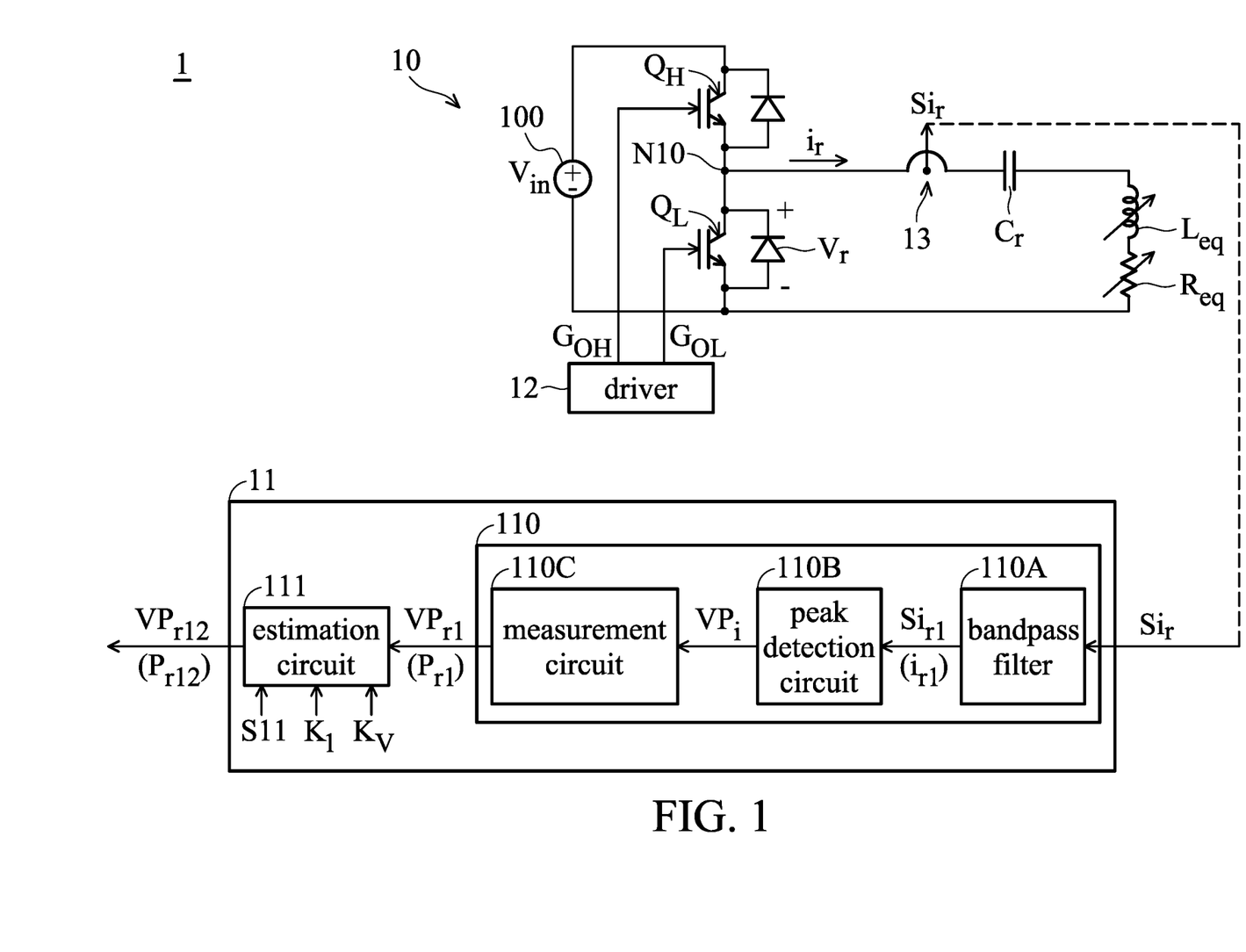
FIG. 1 shows one exemplary embodiment of an electronic device comprising a resonant circuit and a power detection circuit.

FIG. 1 shows an exemplary embodiment of an electronic device. Referring to FIG. 1, an electronic device 1 comprises a resonant circuit 10, a power detection circuit 11, a driver 12, and a current sensor 13. The power detection circuit 11 is used to detect current total input power of the resonant circuit 10. In an embodiment, the electronic device 1 may be any device that needs to convert energy using a resonant circuit, such as a wireless signal transceiver, an induction cooker, and the like. Hereinafter, the technical features of the present application will be described by taking the electronic device 1 as an induction cooker as an example.

Referring to FIG. 1, the resonant circuit 10 is coupled to a voltage source 100 to receive an input voltage $V_{in}$. The resonant circuit 10 comprises an upper-arm switching element $Q_H$, a lower-arm switching element $Q_L$, a resonant capacitor Cr, an inductor $L_{eq}$, and a resistor $R_{eq}$. The upper-arm switching element $Q_H$ and the lower-arm switching element $Q_L$ are connected in series between the positive terminal and the negative terminal of the voltage source 100. The driver 12 generates switching signals $G_{OH}$ and $G_{OL}$ to control the on/off states of the upper-arm switching element $Q_H$ and the lower-arm switching element $Q_L$, respectively. In the embodiment, each of the switching signals $G_{OH}$ and $G_{OL}$ has a duty cycle, so that the controlled upper-arm switching element $Q_H$ and the lower-arm switching element $Q_L$ operate according to their corresponding duty cycles. Through the control of the switching signals $G_{OH}$ and $G_{OL}$, each of the upper-arm switching element $Q_H$ and the lower-arm switching element $Q_L$ is switched between the on state and the off state, and the on time of the upper-arm switching element $Q_H$ and the on time of the lower-arm switching element $Q_L$ do not overlap.

Referring to FIG. 1, in cases where the electronic device 1 is an induction cooker, the inductor $L_{eq}$ and the resistor $R_{eq}$ in the resonant circuit 10 are the equivalent inductance and equivalent resistance of the pot placed on the electronic device (the induction cooker) 1, respectively. The resonant capacitor Cr, inductor $L_{eq}$, and resistor $R_{eq}$, which are connected in series, form a resonant slot of the resonant circuit 10. The resonant circuit 10 is coupled to the common node N10 between the upper-arm switching element $Q_H$ and the lower-arm switching element $Q_L$. By controlling each of the upper-arm switching element $Q_H$ and the lower-arm switching element $Q_L$ to switch between the on state and the off state, a resonant-slot voltage $v_r$ is generated between the drain and the source of the lower-arm switching element $Q_L$, and a resonant-slot current $i_r$ flows through the capacitor $C_r$. As shown in FIG. 1, the resonant-slot current $i_r$ flows from the common node N10 to the resonant slot. It can be discerned from the circuit structure of the resonant circuit 10 that the resonant circuit 10 is a half-bridge series resonant circuit.

As shown in FIG. 1, the current sensor 13 is coupled to the resonant slot of the resonant circuit 10 at the common node N10 to sense the resonant-slot current ir. The current sensor 13 generates a current signal $Si_r$ according to the sensed resonant-slot current ir. In the embodiment of FIG. 1, the current sensor 13 is arranged outside the power detection circuit 11. In other embodiments, the current sensor 13 may be included within the power detection circuit 11.

The power detection circuit 11 comprises a detection circuit 110 and an estimation circuit 111. The detection circuit 110 receives the current signal $Si_r$ and obtains baseband power $P_{r1}$ of the resonant slot according to the current signal $Si_r$ to generate the baseband power value $VP_{r1}$. The estimation circuit 111 receives the baseband power value $VP_{r1}$ and estimates current total input power $P_{r12}$ of the resonant slot according to the baseband power value $VP_{r1}$ to generate an estimated power value $VP_{r12}$. The detailed operations of the detection circuit 110 and the estimation circuit 111 will be described below.

Referring to FIG. 1, the detection circuit 110 comprises a bandpass filter 110A, a peak detection circuit 110B, and a measurement circuit 110C. The bandpass filter 110A receives the current signal $Si_r$ from the current sensor 13 and performs a bandpass filtering operation on the current signal $Si_r$ to obtain a baseband current $i_{r1}$ of the resonant slot (that is, the baseband component of the resonant-slot current $i_r$). The bandpass filter 110A generates a baseband current signal $Si_{r1}$ representing the baseband current $i_{r1}$, and outputs it to the peak detection circuit 110B.

The peak detection circuit 110B is coupled to the bandpass filter 110A and receives the baseband current signal $Si_{r1}$ from the bandpass filter 110A. Since the baseband current signal $Si_{r1}$ represents the baseband current the peak detection circuit 110B can detect a peak value $VP_i$ of the baseband current according to the baseband current signal $Si_{r1}$. The peak detection circuit 110B transmits the detected peak value $VP_i$ to the measurement circuit 110C.

The measurement circuit 110C is coupled to the peak detection circuit 110B and receives the peak value $VP_i$. The measurement circuit 110C measures the baseband power $$P_{r1}(P_{r1} = \frac{1}{2}i_{r1}^2 R_1)$$

of the resonant slot according to the peak value $VP_i$ and the baseband resistance $R_1$ of the resonant slot to generate a corresponding baseband power value $VP_{r1}$. In cases where the baseband power $P_{r1}$ is calculated, the parameter $i_{r1}$ (baseband current) in the above equation is taken as the peak value $VP_i$. After the baseband power $P_{r1}$ is calculated, the measurement circuit 110C generates the corresponding baseband power value $VP_{r1}$ and transmits it to the estimation circuit 111. In the embodiment, the value of the baseband resistance $R_1$ is predetermined and stored in the measurement circuit 110C in advance. In other embodiments, the value of the baseband resistance $R_1$ is predetermined and may be stored in a memory (not shown) of the electronic device 1 in advance. When the power detection circuit 11 operates, the value of the baseband resistance $R_1$ is read from the memory.

The estimation circuit 111 is coupled to the measurement circuit 110C and receives the baseband power value $VP_{r1}$. The estimation circuit 111 obtains the baseband power $P_{r1}$ of the resonant slot according to the baseband power value $VP_{r1}$. The estimation circuit 111 also receives an indication signal S11 which represents the duty cycle of the switching signal $G_{OH}$. In the embodiment, the estimation circuit 111 determines whether the duty cycle of the switching signal $G_{OH}$ is greater than a threshold value (for example, 30% or 50%) according to the indication signal S11. In the case where it is determined that the duty cycle of the switching signal $G_{OH}$ is not greater than the threshold value, the estimation circuit 111 compensates the baseband power $P_{r1}$ by a compensation parameter K to obtain the estimated current total input power $P_{r12}$, and it generates an estimated power value $VP_{r12}$ according to the estimated current total input power $P_{r12}$. In cases where it is determined that the duty cycle of the switching signal $G_{OH}$ is greater than the threshold value, the estimation circuit 111 directly uses the baseband power value $VP_{r1}$ as the estimated power value $VP_{r12}$.

In the embodiment, the compensation parameter K is equal to the ratio of the predetermined frequency-doubling power to the predetermined baseband power of the resonant slot at a specific duty cycle D. The compensation parameter K is predetermined and can be stored in the estimation circuit 111 in advance. In other embodiments, the value of the compensation parameter is a predetermined parameter, which may be stored in a memory (not shown) of the electronic device 1 in advance. When the power detection circuit 11 operates, the compensation parameter K is read from the memory.

According to the embodiments of the present application, only the baseband power of the resonant slot is required for estimating the current total input power $P_{r12}$ of the resonant slot without complex calculations. Moreover, due to the compensation mechanism of the estimation circuit 111, the current total input power $P_{r12}$ (the estimated power value $VP_{r12}$) obtained in the present application is obtained with high accuracy.

The following will describe the analysis related to how the power detection circuit 11 of the present application can obtain the accurate current total input power $P_{r12}$ according to the baseband power of the resonant slot.

Figure 2:
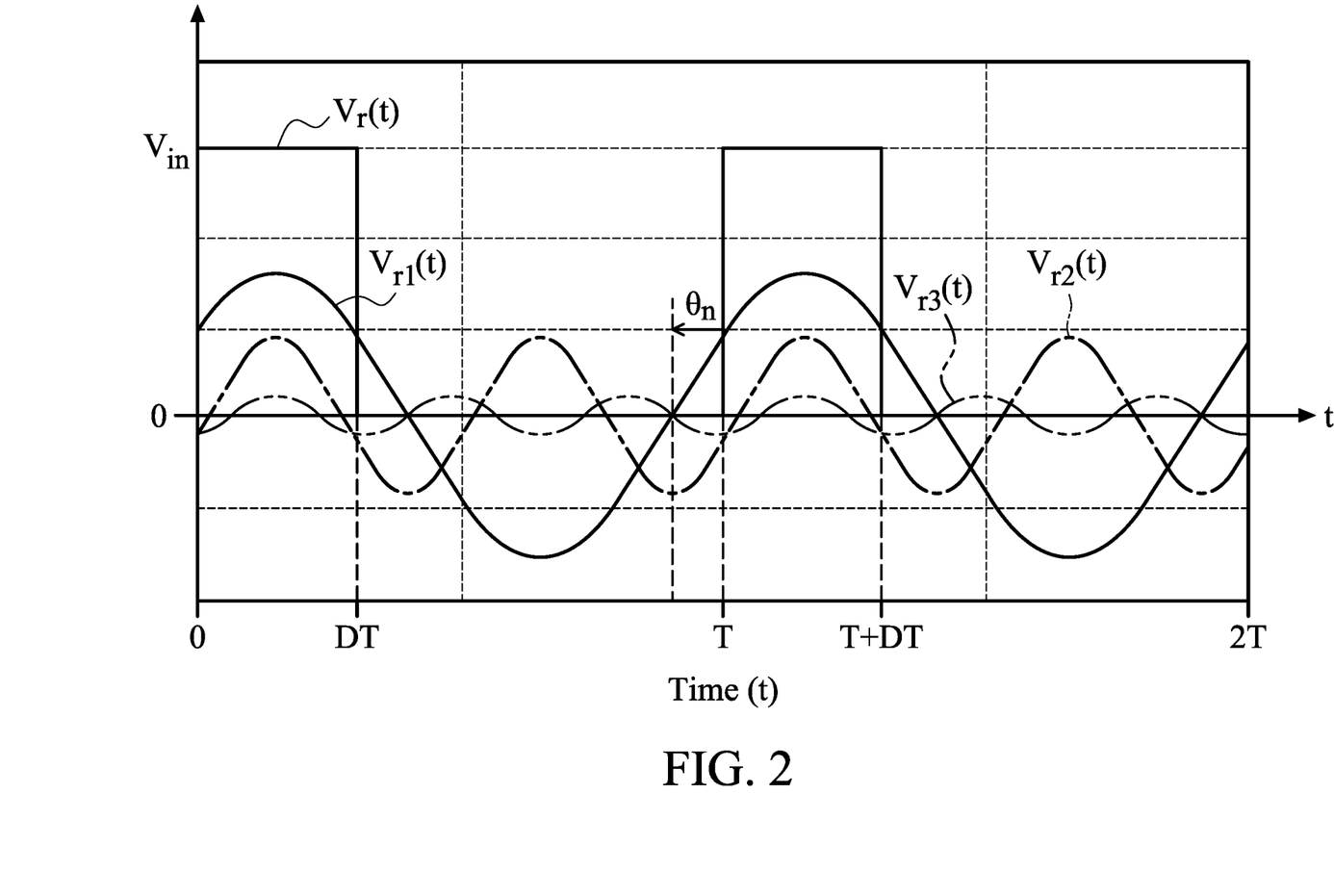
FIG. 2 shows a resonant-slot voltage of the resonant circuit in FIG. 1 and harmonic components of the resonant-slot voltage.

FIG. 2 shows the resonant-slot voltage $v_r$ of the resonant circuit 10 and the harmonic components of the resonant-slot voltage $v_r$. Referring to FIG. 2, the maximum value of the resonant-slot voltage $v_r$ is the input voltage $V_{in}$. $v_{r1}$ represents the baseband component of the resonant-slot voltage $v_r$ (also called the baseband voltage of the resonant slot), $v_{r2}$ represents the frequency-doubling component of the resonant-slot voltage $v_r$ (also called the frequency-doubling voltage of the resonant slot), and $v_{r3}$ represents the frequency-tripling component of the resonant-slot voltage $v_r$ (also called the frequency-tripling component of the resonant slot). The resonant-slot voltage $v_r$ can be expressed as:

$$v_r(t) = \begin{cases} V_{in}, & |t| \leq DT \\ 0, & |t| > DT \end{cases}, \quad 0 \leq t \leq T \qquad \text{Equation (1)}$$

wherein:

$f_s$ represents the switching frequency of the resonant-slot voltage $v_r$;

$$T\left(=\frac{1}{f_s}\right)$$

represents the switching period of the switching frequency; and

D represents the duty cycle of the switching signal $G_{OH}$ (that is, the ratio of the turned-on time of the upper-arm switching element $Q_H$ to the period).

Equation (1) is expressed based on Fourier series as:

$$v_r(t) = DV_{in} + \sum_{n=1}^{\infty} \frac{2V_{in}}{n\pi} |\sin(nD\pi)| \sin\left(\frac{2n\pi}{T}t + \theta_n\right) \qquad \text{Equation (2)}$$

wherein:

$$\theta_n = \tan^{-1}\left(\frac{\sin(2nD\pi)}{1 - \cos(2nD\pi)}\right);$$

$V_{in}$ represents the maximum value of the square wave of the resonant-slot voltage $v_r$ (that is, the input voltage);

n represents the harmonic order of the resonant-slot voltage $v_r$; and $\theta_n$ represents n-th harmonic phase angle.

Assuming that the duty cycle D is equal to 30% as an example. After D=0.3 is applied to Equation (2), we get:

$$v_r(t) = 0.3V_{in} + \sum_{n=1}^{\infty} \frac{2V_{in}}{n\pi} |\sin(0.3n\pi)| \sin\left(\frac{2n\pi}{T}t + \theta_n\right) \qquad \text{Equation (3)}$$

In cases where only the peak values (maximum values) of the voltage is considered, the peak values of the baseband voltage $v_{r1}$, the frequency-doubling voltage $v_{r2}$, and the frequency-tripling voltage $v_{r3}$ are $0.515V_{in}$, $0.303V_{in}$, and $0.066V_{in}$, respectively. From these values, it can be observed that the peak value of the baseband voltage $v_{r1}$ is greater than the peak value of the frequency-doubling voltage $v_{r2}$ and is much larger than the peak value of the frequency-tripling voltage $v_{r3}$. Therefore, the influence of the frequency-tripling voltage $v_{r3}$ can be ignored for the power detection.

Since the input impedance of the resonant slot increases with the increase of the operation frequency of the resonant circuit 10 it is only necessary to consider the effect of the low-order voltage harmonics (that is, the baseband harmonic and frequency-doubling harmonic) on the total input power of the resonant slot in response to the above analysis for the baseband voltage $v_{r1}$, the frequency-doubling voltage $v_{r2}$, and the frequency-tripling voltage $v_{r3}$.

Figure 4:
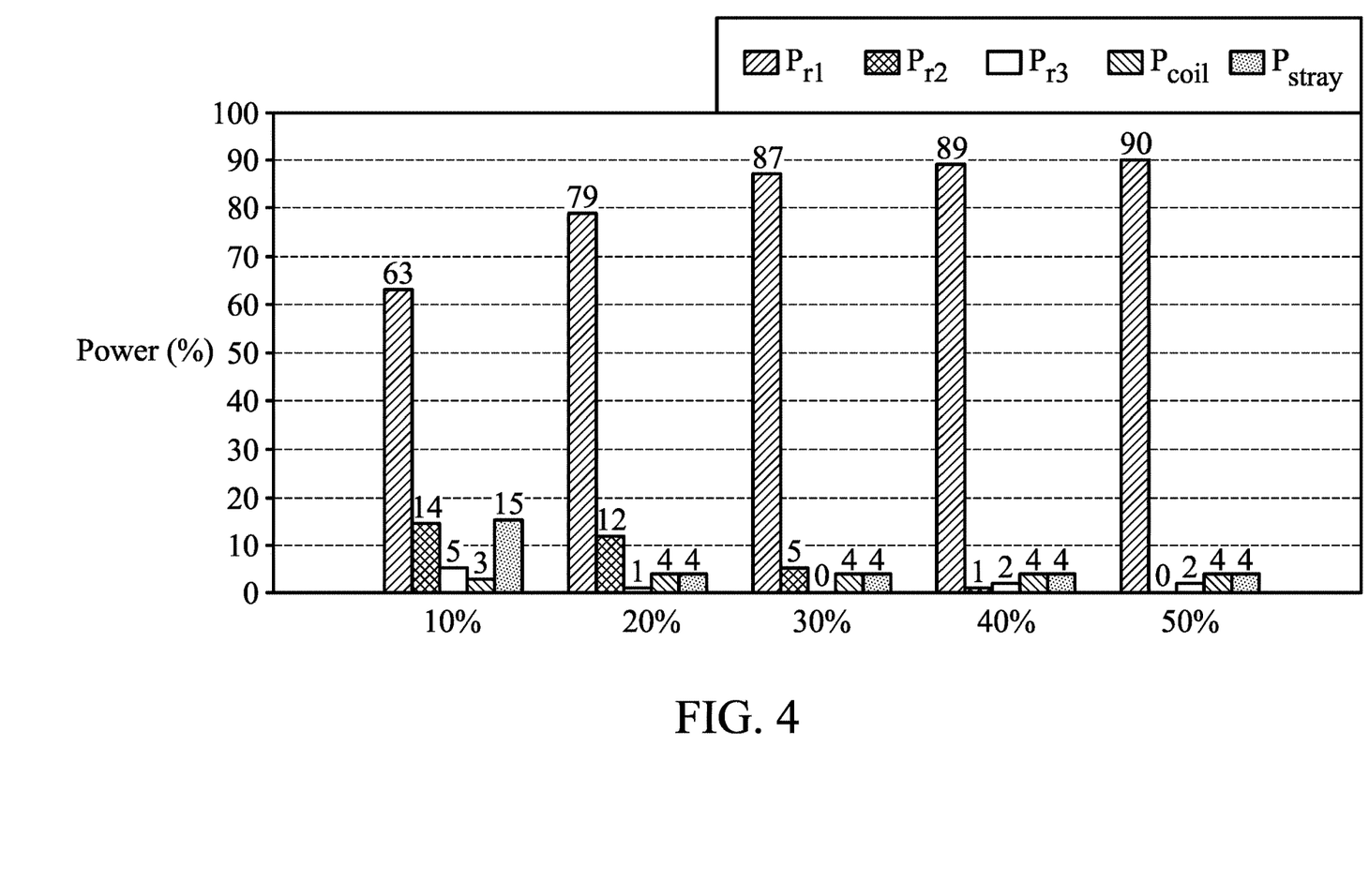
FIG. 4 shows percentages of baseband power, frequency-doubling power, frequency-tripling power, coil loss power, and stray loss power of the resonant slot in relative to total power at different duty cycles of the resonant circuit.

The applicant of the present application simulated the power distribution of the resonant circuit 10. FIG. 4 shows the percentages of the baseband power $P_{r1}$, the frequency-doubling power $P_{r2}$, the frequency-tripling power $P_{r3}$, the coil loss power $P_{coil}$, and the stray loss power $P_{stray}$ in the total power $P_r$ when the duty cycle D is 10%, 20%, 30%, 40%, and 50%, respectively. As shown in FIG. 4, when the duty cycle D is equal to or less than 30%, the baseband power $P_{r1}$ accounts for less than 90% of the total power $P_r$, and the frequency-tripling power $P_{r3}$, the coil loss power $P_{coil}$, and the stray loss power $P_{stray}$ each accounts for less than 5% of the total power $P_r$. When the duty cycle D is greater than 30%, the baseband power $P_{r1}$ is almost equal to the total power $P_r$, and the frequency-doubling power $P_{r2}$, the frequency-tripling power $P_{r3}$, the coil loss power $P_{coil}$, and the stray loss power $P_{stray}$ each also accounts for less than 5% of the total power $P_r$.

According to the above analysis, when the duty cycle D is large, since the baseband power $P_{r1}$ is almost equal to the total power Pr, the estimation circuit 111 does not need to compensate the baseband power $P_{r1}$ and directly uses the baseband power value $VP_{r1}$ as the estimated power value $VP_{r12}$, so that the current total input power $P_{r12}$ of the circuit 10 can be accurately estimated. As mentioned above, when the duty cycle D is small, the baseband power $P_{r1}$ accounts for less than 90% of the total power $P_r$ and the frequency-doubling power $P_{r2}$ still accounts for a considerable proportion in the total power $P_r$. In order to more accurately estimate the current total input power $P_{r12}$ according to the baseband power $P_{r1}$, the estimation circuit 111 compensates the baseband power $P_{r1}$ using the compensation parameter K to obtain the estimated power value $VP_{r12}$.

In an embodiment, the estimation circuit 111 sets a threshold value and determines whether to compensate the baseband power $P_{r1}$ according to whether the duty cycle D is greater than the threshold value. According to the above description, the threshold can be set to 30%.

The definition of the compensation parameter K will be described below.

Assuming that the current total input power $P_{r12}$ is an estimated by the baseband power $P_{r1}$ and the frequency-doubling power $P_{r2}$ of the resonant slot, $P_{r12}$ can be expressed as:

$$P_{r12} = P_{r1} + P_{r2} = P_{r1}\left(1 + \frac{P_{r2}}{P_{r1}}\right) \qquad \text{Equation (4)}$$

$$P_{r1} = \left(\frac{v_{r1}}{Z_1}\right)^2 R_1 \text{ and } P_{r2} = \left(\frac{v_{r2}}{Z_2}\right)^2 R_2$$

are applied to Equation (4), and then Equation (4) is rewritten as:

$$P_{r12} = P_{r1}\left[1 + \left(\frac{v_{r2}}{v_{r1}}\right)^2 \left(\frac{Z_1}{Z_2}\right)^2 \frac{R_2}{R_1}\right] \qquad \text{Equation (5)}$$

wherein:

$$v_{r1}(=\frac{2V_{in}}{\pi}\sin(D\pi))$$

represents the baseband voltage of the resonant slot;

$$v_{r2}(=\frac{V_{in}}{\pi}\sin(2D\pi))$$

represents the frequency-doubling voltage of the resonant slot;

$$Z_1(=R_1+j\omega_s L_1-j\frac{1}{\omega_s C_r})$$

represents the input baseband impedance of the resonant slot;

$$Z_2(=R_2+j2\omega_s L_2-j\frac{1}{2\omega_s C_r})$$

represents the input frequency-doubling impedance of the resonant slot;

$R_1$, $R_2$ represent the baseband resistance and the frequency-doubling resistance of the resonant slot respectively;

$L_1$, $L_2$ represent the baseband inductance and the frequency-doubling inductance of the resonant slot respectively;

$\omega_s$ represents the operation angular velocity.

$$\left(\frac{Z_1}{Z_2}\right)^2 \cdot \frac{R_2}{R_1}$$

in Equation (5) is rewritten as:

$$\left(\frac{Z_1}{Z_2}\right)^2 \frac{R_2}{R_1}=\frac{R_2(R_1^2+(\omega_s L_1-\frac{1}{\omega_s C_r})^2)}{R_1(R_2^2+(2\omega_s L_2-\frac{1}{2\omega_s C_r})^2)} \quad \text{Equation (6)}$$

$$\left(\frac{v_{r2}}{v_{r1}}\right)^2 \left(\frac{Z_1}{Z_2}\right)^2 \frac{R_2}{R_1}$$

in Equation (5) is set as K, wherein $$\left(\frac{v_{r2}}{v_{r1}}\right)^2$$

is $K_v$, and $$\left(\frac{Z_1}{Z_2}\right)^2 \frac{R_2}{R_1}$$

is $K_1$ and then Equation (5) is rewritten as:

$$P_{r12}=P_{r1}(1+K)=P_{r1}(1+K_v K_1) \quad \text{Equation (7)}$$

Further, $$K_v=\left(\frac{v_{r2}}{v_{r1}}\right)^2=\left(\frac{\sin(2D\pi)}{2\sin(D\pi)}\right)^2 \quad \text{Equation (8)}$$

$$K_1=K_R\frac{R_1^2+(\omega_s L_1)^2(1-K_\omega)^2}{(K_R R_1)^2+(2\omega_s K_L L_1)^2(1-\frac{K_\omega}{4K_L})^2} \quad \text{Equation (9)}$$

$$K_\omega=\left(\frac{\omega_o}{\omega_s}\right)^2 \quad \text{Equation (10)}$$

$$K_R=\frac{R_2}{R_1} \quad \text{Equation (11)}$$

$$K_L=\frac{L_2}{L_1} \quad \text{Equation (12)}$$

wherein, $\omega_o$ is the natural resonant angular velocity.

According to Equation (4) and Equation (7), the compensation parameter K is the ratio of the frequency-doubling power $P_{r2}$ to the baseband power $P_{r1}$. According to Equation (5), Equation (7), and Equation (8), the parameter $K_v$ is related to the ratio of the frequency-doubling voltage $v_{r2}$ to the baseband voltage $v_{r1}$, and the parameter $K_1$ is related to the ratio of the frequency-doubling resistance and the baseband resistance. When the duty cycle D is 10%, 20%, and 30%, the parameter $K_v$ is 0.9, 0.65, and 0.35, respectively. Therefore, according to Equation (8), it can be known that when the duty cycle D is larger, the proportion of the double frequency power Pr2 is lower, which means that the error which is induced when the current total input power $P_{r12}$ is estimated according to the baseband power $P_{r1}$ is smaller.

According to the above, when the duty cycle D is smaller, the parameter $K_v$ is larger, that is, the proportion of the frequency-doubling power Pr2 is larger. Therefore, when the current total input power $P_{r12}$ is estimated according to the baseband power $P_{r1}$, the baseband power $P_{r1}$ needs to be compensated. In the embodiment of the present application, the compensation parameter K is used to compensate the baseband power $P_{r1}$, wherein the compensation parameter K is equal to the ratio of the frequency-doubling power $P_{r2}$ to the baseband power $P_{r1}$ and further equal to the product of the parameters $K_v$ and $K_1$ (K=$K_v K_1$).

Figure 5:
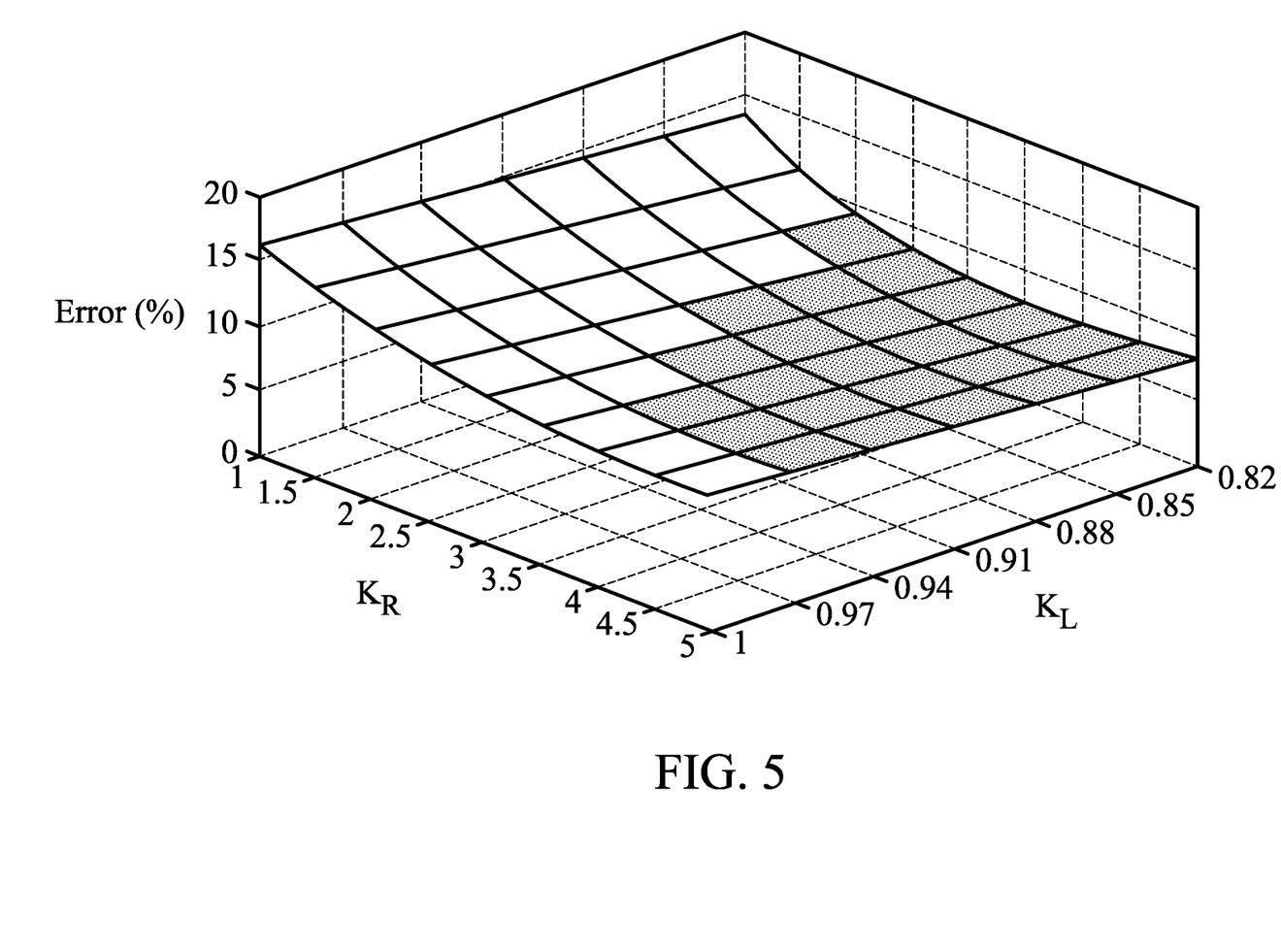
FIG. 5 shows errors of parameters $K_L$, and $K_R$ and corresponding parameter $K_1$ under a general operation of an induction cooker.

According to Equation (10) to Equation (12), the parameter $K_1$ is determined according to the parameters $K_L$, and $K_R$. FIG. 5 shows errors of parameters $K_L$, and $K_R$ and corresponding parameter $K_1$ under a general operation of an induction cooker. As shown in FIG. 5, within a wide variation range of the parameters $K_L$, and $K_R$ (the areas marked with dots in FIG. 5), the error of parameter $K_1$ is less than 10%, which means that the variation range of the parameter $K_1$ is not large. The parameter $K_1$ can be regarded as a parameter not affected by the duty cycle D. Therefore, according to the embodiment of the present application, the electronic device 1 can first obtain the compensation parameter K at a specific duty cycle D through a test or analysis, then obtain the parameter $K_v$ according to Equation (8), and finally estimate the parameter $K_1$ is according to the compensation parameter K and the parameter $K_v$. The obtained compensation parameter K and the parameters $K_v$ and $K_1$ are stored in a memory of the electronic device 1 or stored in the estimation circuit 111 as predetermined parameters which can be used by the power detection circuit 11 during the operation.

In an embodiment, the electronic device 1 predetermines the compensation parameter K and the parameters $K_v$ and $K_1$ which all correspond to the duty cycle D of 10%. In this case, the estimation circuit 111 sets the threshold value as 30% as a criterion for determining whether to compensate the baseband power $P_{r1}$.

In other embodiments, the electronic device 1 may predetermine a plurality of compensation parameters K and a plurality of parameters $K_v$ and $K_1$ corresponding to a plurality of duty cycles as the predetermined parameters. When the power detection circuit 11 operates, one compensation parameter K or one set of parameters $K_v$ and $K_1$ among the predetermined parameters can be selected according to the indication signal S11 which represents the duty cycle D of the switching signal $G_{OH}$ to compensate the baseband power $P_{r1}$.

In the above embodiment, the estimation circuit 11 determines whether to compensate the baseband power $P_{r1}$ according to whether the duty cycle D is greater than a threshold value. In other embodiments, regardless of the duty cycle D of the switching signal $G_{OH}$, the estimation circuit 111 compensates the baseband power $P_{r1}$ according to the compensation parameter K to obtain the estimated current total input power $P_{r12}$, and generates the estimated power value $VP_{r12}$ according to the estimated current total input power $P_{r12}$.

Figure 3:
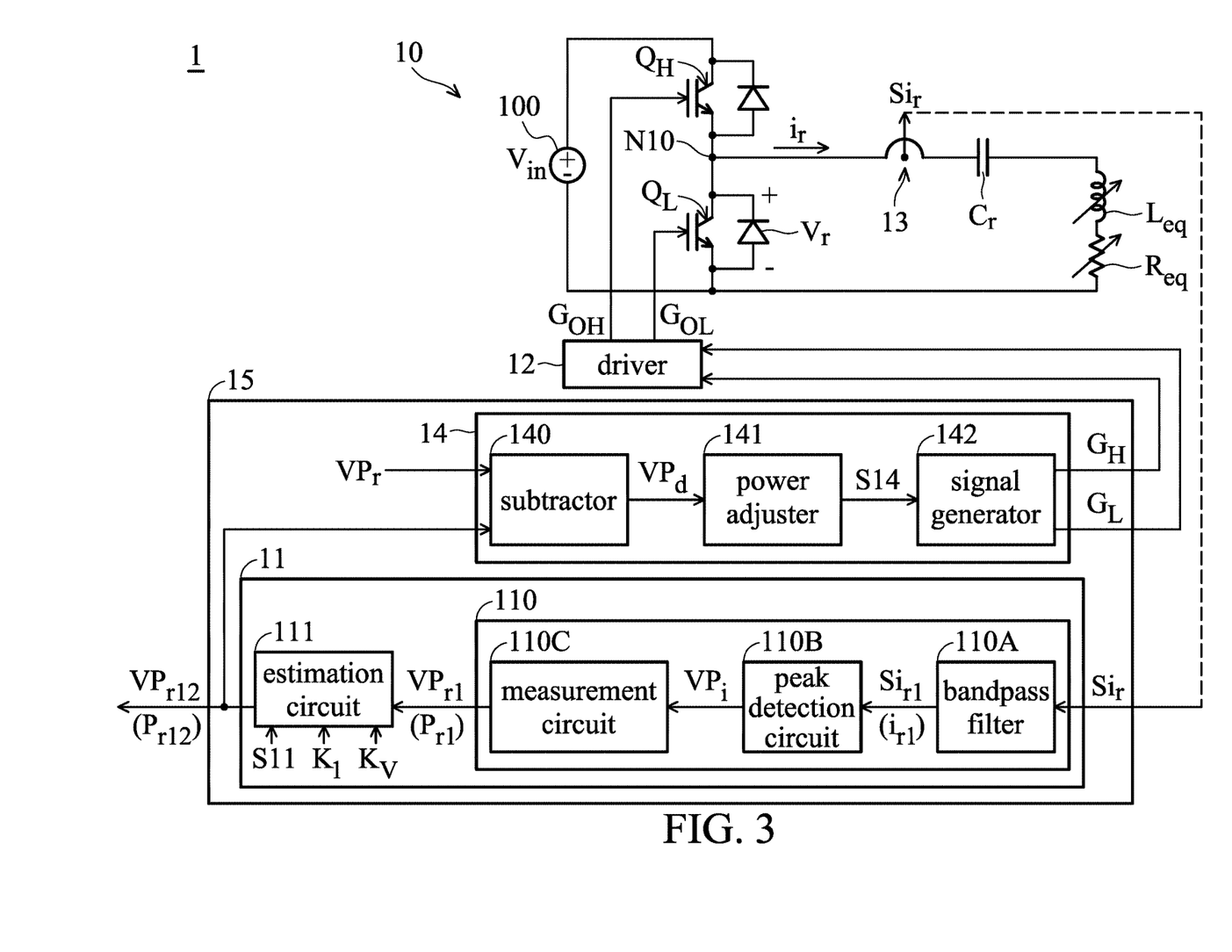
FIG. 3 shows another exemplary embodiment of an electronic device comprising a resonant circuit, a power detection circuit, and an adjustment circuit.

FIG. 3 shows another exemplary embodiment of an electronic device. Referring to FIG. 3, the electronic device 3 comprises a resonant circuit 10, a power detection circuit 11, a driver 12, and a current sensor 13 as shown in FIG. 1. The operations of the resonant circuit 10, the power detection circuit 11, the driver 12, and the current sensor 13 are described in the paragraphs related to the embodiment of FIG. 1, and the description is omitted here.

As shown in FIG. 3, the electronic device 3 further comprises an adjustment circuit 14. A control circuit 15 is composed of the power detection circuit 11 and the adjustment circuit 14 for controlling the resonant circuit 10. The adjustment circuit 14 receives the estimated power value $VP_{r12}$ from the estimation circuit 111 and generates the control signals $G_H$ and $G_L$. The adjustment circuit 14 calculates a power difference between the estimated power value $VP_{r12}$ and the preset power value $VP_r$ and adjusts the respective duty cycles of the control signals $G_H$ and $G_L$ according to the power difference.

In the embodiment of FIG. 3, the current sensor 13 is arranged outside the control circuit 15. In other embodiments, the current sensor 13 may be included within the control circuit 15.

The driver 12 receives the control signals $G_H$ and $G_L$ from the adjustment circuit 14 and generates the switching signals $G_{OH}$ and $G_{OL}$ according to the control signals $G_H$ and $G_L$ to control the on/off states of the upper-arm switching element $Q_H$ and the lower-arm switching element $Q_L$, respectively. Therefore, the adjustment circuit 14 adjusts or changes the respective duty cycles of the switching signals $G_{OH}$ and $G_{OL}$ by adjusting the respective duty cycles of the control signals $G_H$ and $G_L$. In the embodiment, the duty cycle of the control signal $G_H$ is equal to the duty cycle (D) of the switching signal $G_{OH}$, and the duty cycle of the control signal $G_L$ is equal to the duty cycle of the switching signal $G_{OL}$.

Referring to FIG. 3, the adjustment circuit 14 includes a subtractor 140, a power adjuster 141, and a signal generator 142. The subtractor 140 receives the estimated power value $VP_{r12}$ and the preset power value $VP_r$ and calculates the difference between the estimated power value $VP_{r12}$ and the preset power value $VP_r$ to generate a power difference value $VP_d$. The subtractor 140 transmits the power difference value $VP_d$ to the power adjuster 141.

The power adjuster 141 receives the power difference $VP_d$ and generates an adjustment signal S14 according to at least one feature of the power difference $VP_d$. In the embodiment, the at least one feature of the power difference $VP_d$ comprises at least one of the magnitude of the power difference $VP_d$ and the polarity (positive or negative) thereof. The adjustment signal S14 indicates how to adjust the duty cycles of the control signals $G_H$ and $G_L$. For example, the adjustment signal S14 indicates at least one of an adjustment range and an adjustment direction (whether increasing or decreasing) for adjusting the duty cycles of the control signals $G_H$ and $G_L$. The power adjuster 141 provides the adjustment signal S14 to the signal generator 142.

The signal generator 142 receives the adjustment signal S14 and generates the control signals $G_H$ and $G_L$. The signal generator 142 adjusts the duty cycles of the control signals $G_H$ and $G_L$ according to the adjustment signal S14. The signal generator 142 provides the control signals $G_H$ and $G_L$ to the driver 12. The driver 12 generates switching signals $G_{OH}$ and $G_{OL}$ according to the control signals $G_H$ and $G_L$ to control the on/off states of the upper-arm switching element $Q_H$ and the lower-arm switching element $Q_L$, respectively.

Through the operations of the power detection circuit 11 and the adjustment circuit 14 in the control circuit 15, the control circuit 15 can estimate the current total input power $P_{r12}$ of the resonant circuit 10 according to the baseband power value $VP_{r1}$ to generate the estimated power value $VP_{r12}$. The duty cycles of the control signals $G_H$ and $G_L$ are adjusted based on the difference between the estimated power value $VP_{r12}$ and the desired preset power value $VP_r$, thereby adjusting the switching signals $G_{OH}$ and $G_{OL}$. Through the estimation and adjustment operations of the control circuit 15, the current total input power $P_{r12}$ of the resonant circuit 10 is finally close to or equal to the desired preset power value $VP_r$.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power detection circuit for detecting current total input power of a resonant circuit, comprising:
   a detection circuit receiving a current signal and obtaining resonant-slot baseband power according to the current signal to generate a baseband power value, wherein the current signal represents a resonant-slot current generated by the resonant circuit; and
   an estimation circuit receiving the baseband power value and estimating the current total input power according to the baseband power value to generate an estimated power value.

2. The power detection circuit as claimed in claim 1, wherein:
   the resonant circuit comprises a switching element, and the switching element operates according to a duty cycle, and
   the estimation circuit obtains the resonant-slot baseband power according to the baseband power value and compensates the resonant-slot baseband power according to a compensation parameter to generate the estimated power value.

3. The power detection circuit as claimed in claim 1, wherein:
the resonant circuit comprises a switching element, and the switching element operates according to a duty cycle,
when the duty cycle is greater than a threshold value, the estimation circuit receives the baseband power value as the estimated power value, and
when the duty cycle is not greater than the threshold value, the estimation circuit obtains the resonant-slot baseband power according to the baseband power value and compensates the resonant-slot baseband power according to a compensation parameter to generate the estimated power value.

4. The power detection circuit as claimed in claim 3, wherein the compensation parameter is related to a ratio of a predetermined frequency-doubling power to a predetermined baseband power of the resonant circuit at a specific value of the duty cycle.

5. The power detection circuit as claimed in claim 1, wherein the detection circuit comprises:
a bandpass filter receiving the current signal and performing a bandpass filtering operation on the current signal to generate a baseband current signal, wherein the baseband current signal represents a resonant-slot baseband current of the resonant circuit;
a peak value detection circuit receiving the baseband current signal and detecting a peak value of the resonant-slot baseband current according to the baseband current signal; and
a measuring circuit receiving the peak value and measuring the resonant-slot baseband power according to the peak value and a baseband resistance to generate the baseband power value.

6. The power detection circuit as claimed in claim 5, wherein the baseband resistance represents a resonant-slot baseband resistance of the resonant circuit.

7. A control circuit for generating a first control signal to control a resonant circuit, comprising:
a detection circuit receiving a current signal and obtaining resonant-slot baseband power according to the current signal to generate a baseband power value, wherein the current signal represents a resonant-slot current generated by the resonant circuit,
an estimation circuit receiving the baseband power value and estimating a current total input power of the resonant circuit according to the baseband power value to generate an estimated power value; and
an adjustment circuit receiving the estimated power value and generating the first control signal, wherein the adjustment circuit calculates a power difference between the estimated power value and a preset power value and adjusts a duty cycle of the first control signal according to the power difference.

8. The control circuit as claimed in claim 7, wherein the estimation circuit obtains the resonant-slot baseband power according to the baseband power value and compensates the resonant-slot baseband power according to a compensation parameter to generate the estimated power value.

9. The control circuit as claimed in claim 7, wherein:
when the duty cycle of the first control signal is greater than a threshold value, the estimation circuit receives the baseband power value as the estimated power value, and
when the duty cycle of the first control signal is not greater than the threshold value, the estimation circuit obtains the resonant-slot baseband power according to the baseband power value and compensates the resonant-slot baseband power according to a compensation parameter to generate the estimated power value.

10. The control circuit as claimed in claim 9, wherein the compensation parameter is related to a ratio of a predetermined frequency-doubling power to a predetermined baseband power of the resonant circuit at a specific value of the duty cycle.

11. The control circuit as claimed in claim 7, wherein the detection circuit comprises:
a bandpass filter receiving the current signal and performing a bandpass filtering operation on the current signal to generate a baseband current signal, wherein the baseband current signal represents a resonant-slot baseband current of the resonant circuit;
a peak value detection circuit receiving the baseband current signal and detecting a peak value of the resonant-slot baseband current according to the baseband current signal; and
a measuring circuit receiving the peak value and a baseband resistance and measuring the resonant-slot baseband power according to the peak value and the baseband resistance to generate the baseband power value.

12. The control circuit as claimed in claim 11, wherein the baseband resistance represents a resonant-slot baseband resistance of the resonant circuit.

13. The control circuit as claimed in claim 7, wherein the adjustment circuit comprises:
a subtractor receiving the estimated power value and the preset power value and calculating the difference between the estimated power value and the preset power value to generate the power difference value;
a power adjuster receiving the power difference and generating an adjustment signal according to at least one feature of the power difference; and
a signal generator generating the first control signal, wherein the signal generator receives the adjustment signal and adjusts the duty cycle of the first control signal according to the adjustment signal.

14. The control circuit as claimed in claim 13, wherein the at least one feature of the power difference comprises at least one of a magnitude and a polarity of the power difference.

15. The control circuit as claimed in claim 13, wherein the adjustment signal indicates at least one of an adjustment amplitude and an adjustment direction for adjusting the duty cycle.

16. The control circuit as claimed in claim 7, wherein the control circuit further generates a second control signal to control the resonant circuit, and the adjustment circuit further adjusts the second control signal according to the power difference.

17. The control circuit as claimed in claim 16, wherein the resonant circuit comprises an upper-arm switching element and a lower-arm switching element which are connected in series, the first control signal is applied to control the upper-arm switching element, and the second control signal is applied to control the lower-arm side switching element.

* * * * *